United States Patent
Zhang

(10) Patent No.: US 11,694,745 B1
(45) Date of Patent: Jul. 4, 2023

(54) SRAM WITH SMALL-FOOTPRINT LOW BIT-ERROR-RATE READOUT

(71) Applicant: Gigajot Technology, Inc., Pasadena, CA (US)

(72) Inventor: Dexue Zhang, Arcadia, CA (US)

(73) Assignee: Gigajot Technology, Inc., Glendale, CA (US)

( * ) Notice: Subject to any disclaimer, the term of this patent is extended or adjusted under 35 U.S.C. 154(b) by 312 days.

(21) Appl. No.: 17/074,444

(22) Filed: Oct. 19, 2020

Related U.S. Application Data

(60) Provisional application No. 62/916,874, filed on Oct. 18, 2019.

(51) Int. Cl.
*G11C 11/412* (2006.01)
*H04N 25/75* (2023.01)
*H04N 25/71* (2023.01)
*G11C 11/418* (2006.01)
*G11C 11/419* (2006.01)

(52) U.S. Cl.
CPC .......... *G11C 11/412* (2013.01); *G11C 11/418* (2013.01); *G11C 11/419* (2013.01); *H04N 25/745* (2023.01); *H04N 25/75* (2023.01)

(58) Field of Classification Search
CPC ... G11C 11/412; G11C 11/418; G11C 11/419; H04N 5/3765; H04N 5/378; H04N 25/745; H04N 25/75
See application file for complete search history.

(56) References Cited

U.S. PATENT DOCUMENTS

| | | | |
|---|---|---|---|
| 6,392,957 B1 | 5/2002 | Shubat et al. | |
| 6,717,877 B2 | 4/2004 | Suzuki et al. | |
| 7,376,032 B2 | 5/2008 | Nguyen et al. | |
| 7,403,433 B2 | 7/2008 | Ahmad | |
| 7,646,658 B2 | 1/2010 | Chen et al. | |
| 2006/0050572 A1 | 3/2006 | Gouin et al. | |
| 2008/0112245 A1 | 5/2008 | Ostermayr et al. | |
| 2013/0322159 A1* | 12/2013 | Pelley | G11C 11/413 365/189.02 |
| 2019/0088309 A1* | 3/2019 | Li | G11C 7/1006 |
| 2019/0088310 A1* | 3/2019 | Li | G11C 7/1006 |
| 2020/0258569 A1* | 8/2020 | Jaiswal | G11C 11/419 |
| 2021/0158854 A1* | 5/2021 | Sinangil | G11C 11/4094 |

FOREIGN PATENT DOCUMENTS

EP 1630815 A1 3/2006

* cited by examiner

*Primary Examiner* — Shahbaz Nazrul
(74) *Attorney, Agent, or Firm* — Robert C. Kowert; Kowert, Hood, Munyon, Rankin & Goetzel, P.C.

(57) ABSTRACT

Conventional SRAM sense-amplifiers are replaced by small-footprint keeper circuits that enable single-ended SRAM readout without bitline precharge, simplifying and relaxing the timing of SRAM cell access and bitline sampling operations and thus enabling potentially faster readout operation and/or lower bit error rate.

21 Claims, 2 Drawing Sheets

SRAM WITH SMALL-FOOTPRINT LOW BIT-ERROR-RATE READOUT

CROSS-REFERENCE TO RELATED APPLICATIONS

This application hereby claims priority to and incorporates by reference U.S. provisional application No. 62/916,874 filed Oct. 18, 2019.

TECHNICAL FIELD

The disclosure herein relates to memory circuitry deployed within imaging integrated circuits (ICs) and others to enable reliable, high-speed data readout.

INTRODUCTION

Integrated-circuit image sensors typically include a pixel-data readout buffer implemented by a conventional a static random access memory (SRAM)— that is, an SRAM cell array and differential sense amplifier bank together with a timing generator to precisely time SRAM cell access (selecting a column of SRAM cells for readout), bit-line precharge and sense-amplifier data capture actions. In the face of next-generation pixel-array densities, scan rates and increased process/voltage/temperature (PVT) sensitivity, operational timing margins are approaching reliability limits, increasing timing-generator complexity/footprint and forcing designers to compromise between read-out and bit-error rates.

DRAWINGS

The various embodiments disclosed herein are illustrated by way of example, and not by way of limitation, in the figures of the accompanying drawings and in which like reference numerals refer to similar elements and in which:

FIG. 3 illustrates a pixel readout architecture having physically interleaved (integrated) count-latch SRAM cells and keeper-readout SRAM cells;

FIG. 4 illustrates a more detailed keeper-readout SRAM embodiment, showing a single column of keeper-readout SRAM cells and their interconnection to a keeper bank via respective bit lines; and FIG. 5 illustrates an exemplary readout timing with respect to successive SRAM cell columns within the keeper-readout SRAM implementations of FIGS. 3 and 4.

DETAILED DESCRIPTION

In various embodiments herein, conventional SRAM sense-amplifiers are replaced by small-footprint keeper circuits that enable single-ended SRAM readout without bitline precharge, simplifying and relaxing the timing of SRAM cell access and bitline sampling operations and thus enabling potentially faster readout operation and/or lower bit error rate. In a number of embodiments, timing offset between cell-access and keeper control signals (the latter referred to herein as a keeper-clock in view of its straightforward production from a readout clock) is imposed by PVT-impervious design-for example, selection from different stages of a clock tree and/or difference in signal line routing and thus propagation time from source to destination—so that the complex and PVT-sensitive timing generator required by conventional sense-amp-based SRAMs may be omitted altogether. As individual keeper circuits are significantly smaller than conventional sense amplifiers (e.g., omitting relatively large bit-line precharge transistors, differential input transistors, cross-coupled pull-up transistors, biasing circuitry, etc.), net readout circuitry footprint may be substantially reduced (e.g., ~20% or more), preserving precious die area for pixel array expansion, on-die image-data processing circuitry, etc.

Figure 1:
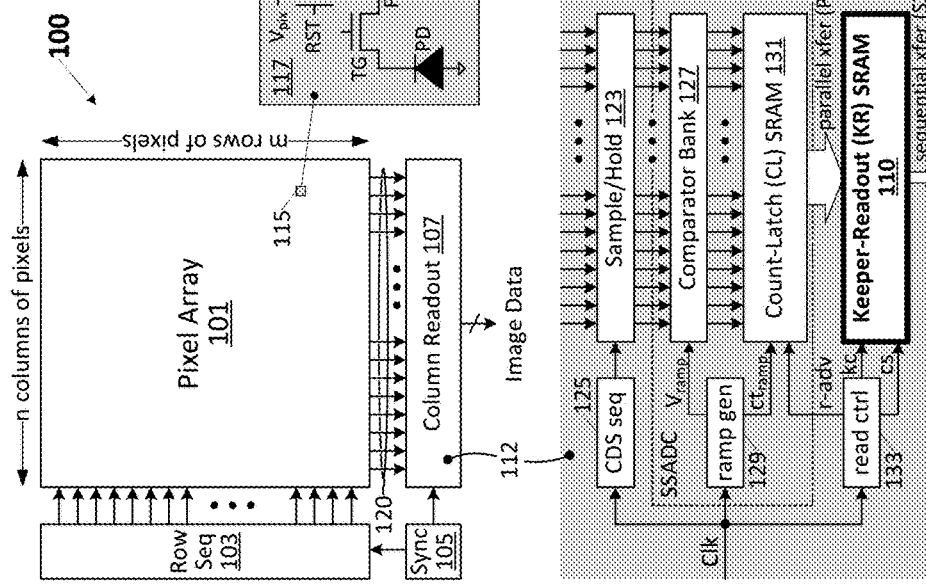
FIG. 1 illustrates an embodiment of an integrated-circuit (IC) imager having a column readout circuit implemented in part by an SRAM with small-footprint keeper-based readout circuitry.

FIG. 1 illustrates an embodiment of an integrated-circuit (IC) imager 100 having a pixel array 101, row sequencer 103, synchronizer 105, and column readout circuit 107, the latter implemented in part by an SRAM with small-footprint keeper-based readout circuitry and thus a "keeper-readout" SRAM as shown at 110 within exemplary column readout detail 112. In the FIG. 1 example, pixel array 101 is constituted by active pixel cells 115 (e.g., four-transistor (4T) pixels having a photodiode (PD), transfer gate (TG), floating diffusion node (FD), source follower transistor (SF), read-select transistor (RS) and reset transistor (RST) as shown in detail view 117) disposed in 'm' rows and 'n' columns. Row sequencer 103 issues transfer-gate, read-select and reset signals to each row of pixels in sequence to implement a row-by-row rolling-shutter readout. During each pixel-row readout or "row scan," column readout circuit 107 digitizes analog pixel signals generated on column output lines 120 (e.g., indicative of photocharge accumulated within respective pixels during a preceding exposure interval) and stores the digital results (digital pixel values) within a data-line memory for readout to downstream processing circuitry (on the imager chip or off). In the implementation shown in detail view 112, for example, a sample-and-hold circuit 123 samples reset-state and signal-state pixel output signals (in response to control signals from sequencer 125) during each row scan cycle to deliver correlated-double-sample (CDS) signals representative of per-pixel accumulated photocharge to comparator bank 127. Comparator bank 127 compares each incoming CDS signal to a ramped analog voltage reference, $V_{ramp}$, that is incrementally stepped between minimum and maximum ramp values (i.e., by ramp generator 129), asserting a respective count-latch signal for each pixel column in response to over-threshold detection (i.e., incremental $V_{ramp}$ step up or step down, e.g. depending on analog pixel signal polarity, crosses the CDS voltage level). Count-latch SRAM 131 responds to the count-latch signal for each pixel column by storing a respective ramp-count value ($ct_{ramp}$) that is sequenced by ramp generator 129 in synchrony with $V_{ramp}$ and thus constitutes a digital value indicative of the $V_{ramp}$ step up or down that crossed the CDS level for that pixel column. Collectively, comparator bank 127, count latch 131 and ramp generator 129 implement a single-slope analog-to-digital converter (SS-ADC) that digitizes the analog CDS signals output from sample-and-hold bank 123.

Still referring to detail view 112 of column readout circuit 107, upon conclusion of each $V_{ramp}$ sequence (i.e., from starting to ending voltage levels and thus completion of an ADC cycle), the digital pixel values captured within count-latch SRAM 131 are transferred in parallel to keeper-readout SRAM 110 for subsequent column-sequential transfer (e.g., one digital pixel value at a time) to downstream circuitry— operations executed in response to control and timing signals from readout controller 133 including, for example, a row-advance signal ("r-adv," marking end of row ADC and count-latch operations) to trigger parallel transfer from count-latch SRAM 131 to keeper-readout SRAM 133, and keeper-clock/column-select signals ("kc," "cs") to sequence through per-column readout of the pixel values transferred into the keeper-readout SRAM 110.

While specific pixel array and column-readout implementations are shown in FIG. 1 and assumed for ease of understanding in embodiments discussed below, the small-footprint, low bit-error-rate keeper-readout SRAM 110 may be deployed in a broad variety of imaging integrated circuits having any practicable pixel architecture (3T pixels, shared-readout pixels to lower effective per-pixel transistor count, time-of-flight pixels, quanta image sensor pixels or other types of photon-sensing pixels, dual-readout-channel-pixels, etc.) and ADC circuitry, the latter including, for example, successive-approximation-register (SAR) or delta-sigma ADC circuitry, various front-end amplifier structures (e.g., programmable gain amplifiers, auto-zeroing circuitry for generation of CDS output rather than separate sample-and-hold elements for reset-state and signal-state outputs, etc.), direct-ADC circuits (no sample/hold bank), and so forth. In the case of SAR or delta-sigma ADC implementations, count-latch SRAM 131 may be omitted in favor of per-column register to hold iteratively generated ADC values that, upon completion of ADC cycle, are transferred in parallel to keeper-readout SRAM 110. More generally, keeper-readout SRAM 110 may be deployed in any integrated circuit that may benefit from low bit error rate (BER) and/or small circuit footprint. Additionally, while keeper-readout SRAM 110 is described in various embodiments below as having a single pixel output port (i.e., to readout the ADC results for a given row of the pixel array one digital pixel value at a time), two or more pixel output ports may be provided to reduce readout latency—particularly in cases of scientific, medical or highly-oversampled imaging applications that require significantly higher row scan rates than, for example, a 30 or 60 frame-per-second imaging applications.

Figure 2:
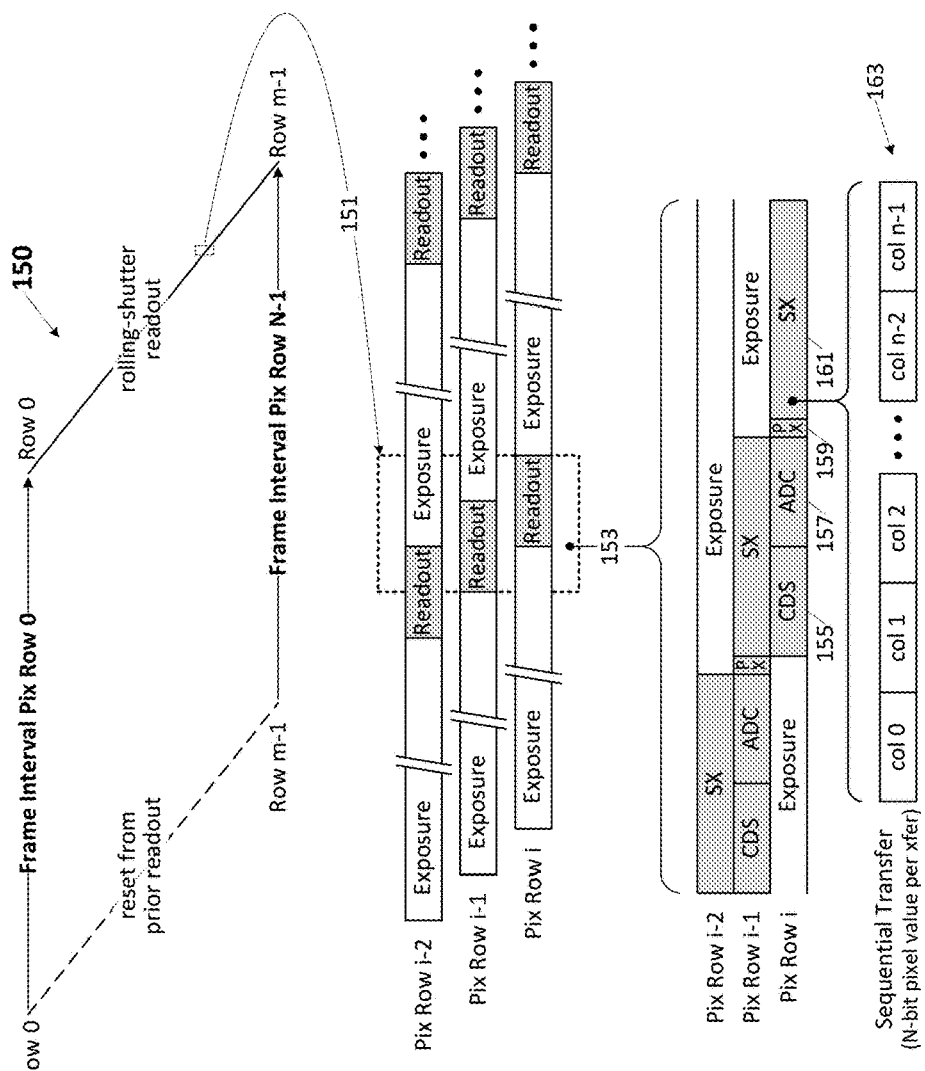
FIG. 2 illustrates an exemplary rolling-shutter readout implemented by the imaging IC of FIG. 1, showing progressive, row-by-row readout with respect to an image frame.

FIG. 2 illustrates an exemplary rolling-shutter readout 150 implemented by the imaging IC of FIG. 1, showing progressive, row-by-row readout with respect to an image frame. Following time-staggered exposure intervals for respective pixel rows, pipelined (time-staggered and partially overlapping) readout operations are executed as shown in expanded view 151. As shown in further detail view 153, each pixel-row readout is implemented by a sequence of transactions including CDS pixel sampling and analog-to-digital conversion at 155 and 157, respectively, followed by a parallel transfer operation (PX) at 159 and then column-sequential readout (SX) from keeper-readout SRAM at 161. In the depicted embodiment, the parallel transfer at 159 frees the count-latch SRAM to capture ADC results with respect to the subsequent pixel row, enabling the column-sequential readout time for a given row (i.e., pixel row 'i−1' in the example shown) to be hidden under the CDS and ADC operations for the subsequent row (e.g., sequential readout of keeper-readout SRAM for pixel row i−1 executed concurrently with CDS and ADC operations for pixel row i). In a single-output-port keeper-SRAM readout implementation, digital pixel values for respective columns of the pixel array are read out from the keeper-readout SRAM one column at a time as shown at 163 (i.e., one digital pixel value at a time). In alternative embodiments having two or more output ports, multiple digital pixel values for respective pixel columns may be readout of the keeper-readout SRAM per readout cycle.

Figures 3, 4, 5:
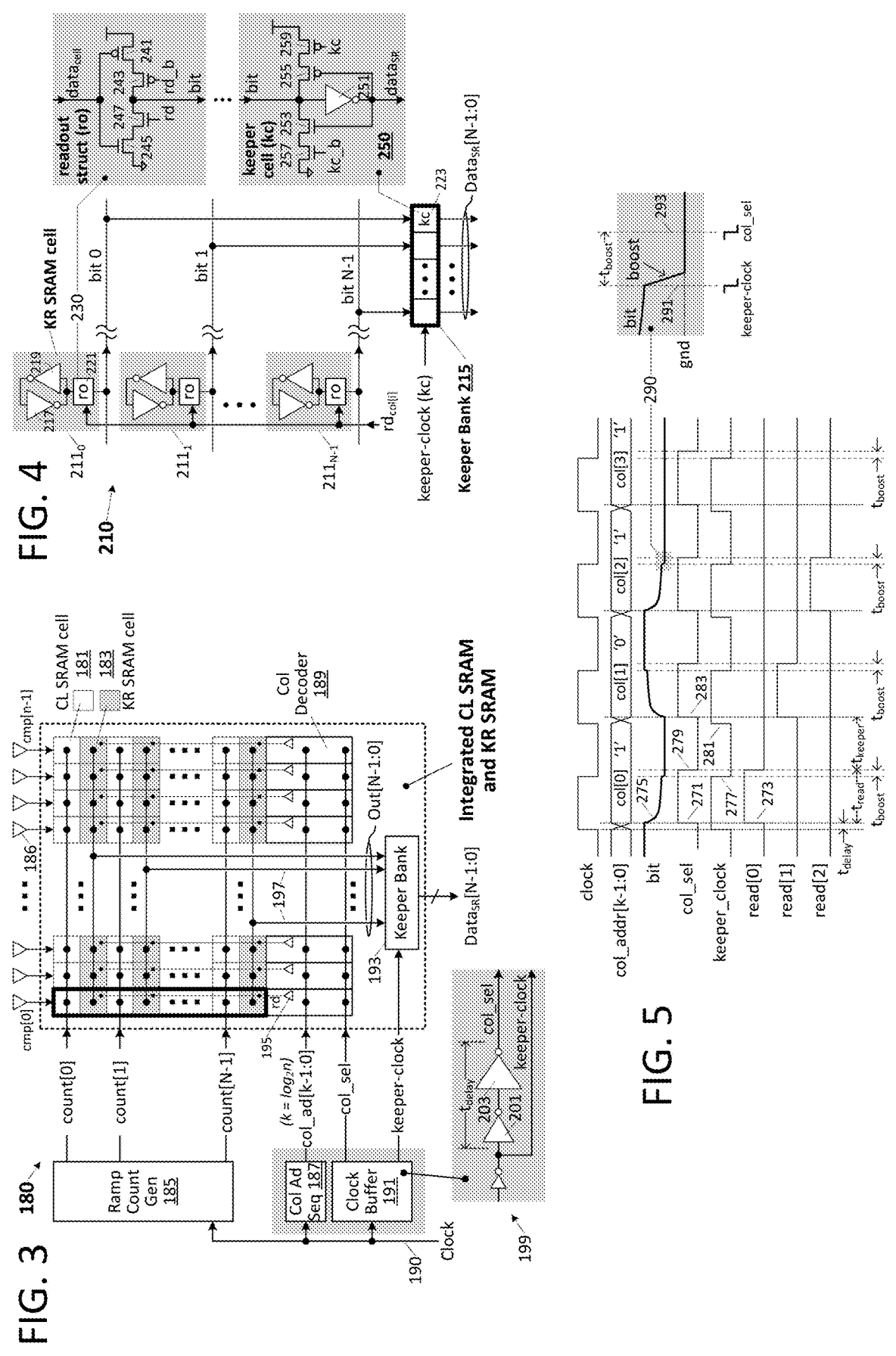

FIG. 3 illustrates a pixel readout architecture 180 having physically interleaved (integrated) count-latch SRAM cells 181 and keeper-readout SRAM cells 183—an approach that shortens the cell-to-cell transfer distance between the two SRAMs (count-latch SRAM and keeper-readout SRAM) to enable exceedingly brief parallel data transfer time (e.g., on the order of a nanosecond or less). In the depicted embodiment, ramp count generator 185 (e.g., a component circuit within ramp generator 129 of FIG. 1) outputs an N-bit ramp count to the count-latch SRAM, with each row of CL SRAM cells 181 receiving a respective bit of the ramp count (count[0], count[1], count[N−1]) and each column of the CL SRAM cells receiving the output of a respective per-column SS-ADC comparator 186 (cmp[0], . . . , cmp[n−1]). By this arrangement, the CL SRAM cells for each pixel column will latch the ramp count output—a digital value between 0 and $2^{N-1}$, inclusively—in response to the SS-ADC comparator output for that column and thus capture a respective digital pixel value corresponding to the SS-ADC ramp voltage that matches, within a quantization step, the analog pixel signal for the corresponding pixel within the pixel row being read-out. At conclusion of the ADC cycle for a given pixel row (e.g., at ramp-count rollover from final count to initial count), the count-bits stored within respective CL SRAM cells are transferred in parallel to the neighboring keeper-readout SRAM cells, thus freeing the count-latch SRAM for storage of ADC outputs for the subsequent pixel row while the contents of the keeper-readout SRAM are read out pixel-value by pixel-value.

Still referring to FIG. 3, column-address sequencer 187 outputs a sequence of k-bit column addresses to per-column decoder circuits 189 to select for readout, during each of a sequence of column readout intervals (e.g., one per cycle of clock signal 190), a respective column of keeper-readout SRAM cells 183 while clock buffer 191 pulses a column-select signal and a keeper-clock signal—supplied to the decoder circuits 189 and keeper bank 193, respectively. By this operation, the 'N' keeper-readout SRAM cells within the address-selected column (i.e., cell column for which decoder 189 asserts read signal "rd" at output of signal-driver element 195) drive respective "bit" signals (i.e., the stored ADC result) onto single-ended SRAM bit lines 197 (Out[N−1:0]) for capture, in response to a keeper-clock edge, within keeper bank 194. In the depicted embodiment, the column-select signal and keeper-clock arrive at their respective destinations (i.e., within column decoders and keeper bank, respectively) with a PVT-insensitive phase offset that ensures reliable pixel data capture within keeper bank 193 without requiring bit line precharge, avoiding the complex and area-consumptive (and PVT-error-susceptible) timing circuitry generally required for bit line precharge and data sensing/latching operations within conventional sense-amplifier-based SRAMs. In one embodiment, for example, the keeper-clock signal and column-select signal are generated by different stages of a clock tree (e.g., as shown conceptually at 199) with $t_{delay}$ resulting from a propagation delay (e.g., through inverters 201 and 203) that ensures data capture within keeper bank 193 across all process, voltage and temperature corners. In alternative embodiments, temporal offset between column-select and keeper clock edges (i.e., $t_{delay}$) is imposed by signal routing delays (i.e., inherently longer propagation delay over column-select line and/or read signal line than keeper-clock line) instead of or in addition to designed-in delay within clock buffer 191.

FIG. 4 illustrates a more detailed keeper-readout SRAM embodiment 210, showing a single column of KR SRAM cells $211_0$-$211_{N-1}$ and their interconnection to a keeper bank 215 via respective bit lines (bit 0, bit 1, . . . , bit N–1). As shown, each KR SRAM cell (collectively, 211—switched connection to corresponding CL SRAM cell not shown) includes a storage latch formed by back-to-back inverters 217, 219 and a single-ended readout structure 221 coupled, via a respective bit line, between the output of one of the inverters (217) and a respective keeper cell 223 ("kc") within keeper bank 215. In one embodiment, shown in detail view 230, in-cell readout structure 221 implements an inverting amplifier that responds to assertion of a read signal (e.g., generated in differential form, rd and rd_b, by column decoder 189 of FIG. 3, or by an in-cell inverter in response to a single-ended read signal from column decoder 189) by driving the bit line (one of bit lines 0 to N–1) high or low in response to a low or high cell data output, respectively (i.e., switching on transistor 241 in response to a '0' cell data value to pull the bit-line high via read-enabled transistor 243 or switching on transistor 245 in response to a '1' cell data value to pull the bit line low via read-enabled transistor 247).

Due the keeper-clock/column-select phase offset discussed above, the keeper clock signal goes low shortly before column-select (and thus shortly before rd goes low and rd_b goes high) to initiate a data-keep operation within each keeper cell 223 while in-cell readout structure is still driving the bit line. Referring to the exemplary keeper-cell implementation at 250, for example, the output "bit" driven onto each bit line by in-cell readout structure 221 is amplified by inverter 251 within the corresponding keeper cell, producing a data output signal (data$_{SR}$) which (i) forms a constituent bit of the keeper-readout SRAM output and (ii) is fed back to latching transistors 253 and 255, switching on either transistor 253 or transistor 255 according to the state of the cell data output (i.e., transistor 253 switched on in response to a logic '1' cell data—inverted by readout structure 221 and then again by keeper-cell inverter 251—and transistor 255 switched on in response to a logic '0' cell data) so that, when keeper-clock goes low to switch on transistors 257 and 259 (differential keeper clock signals kc and kc_b being supplied to respective gates of those transistors), the bit line state driven by in-cell readout structure 221 is reinforced (i.e., boosted, subject to positive feedback, etc.) and latched. More specifically, if the cell data output is a logic 1, the logic '0' output from readout structure 221 will yield a logic '1' data output from keeper inverter 251 (matching the original cell data polarity) that will switch on transistor 253 and thus reinforce the low state of the bit line via transistor 257 when kc_b goes high (i.e., when keeper-clock goes low), snapping the state of the bit line to ground via transistors 253 and 257 and thus latching the data output from inverter 251 until keeper-clock goes high again. Similarly, a logic '0' cell data output will drive the bit line high and thus yield a logic '0' output from keeper-cell inverter 251 that will reinforce the high state of the bit line via transistors 255 and 259 when keeper-clock goes low.

FIG. 5 illustrates an exemplary readout timing with respect to successive SRAM cell columns within the keeper-readout SRAM implementations of FIGS. 3 and 4. As shown, the digital pixel value within respective columns of keeper-readout (KR) SRAM cells are read out in successive cycles of the column clock signal ("clock") with the column address ("col_addr[k–1:0]") being sequenced linearly from 0 to n–1 (i.e., where n=$2^k$–other sequencing patterns may be implemented) to achieve a complete readout with respect to a given pixel row over an 'n' clock cycle interval. In the depicted embodiment, the column clock signal provides timing edges for generation of the keeper clock ("keeper_clock") and column-select signals ("col_sel") which, as discussed above, are offset relative to one another by that the $t_{delay}$ so keeper_clock signal goes low slightly before the column select signal to implement bit-signal boosting/latching operations (during interval $t_{boost}$) within respective cells of the keeper bank. In a logic '1' readout from a KR SRAM cell in array col[0], for example (i.e., column address=0, cell data=1), assertion of the column-select signal at 271 drives the read signal for that column high (read[0] goes high at 273, which may include differential component signals rd[0] and rd_b[0] as discussed above) to enable the in-cell readout structure shown at 230 in FIG. 4 to drive the bit line ("bit") low as shown at 275 (i.e., pulling down a previously logic high bit line state). The readout structure continues to drive the bit line while column-select/read[0] remain asserted (and thus throughout a "read" interval 1 that extends for roughly a half clock cycle (tread) in the depicted embodiment and possibly longer where the duty cycle of the column-select signal exceeds 50%) with that bit-line drive being boosted and latched during the ensuing $t_{boost}$ interval that transpires between the falling edges 277, 279 of the keeper clock and column-select signals. After column-select signal deassertion at 279 (end of tread), the latching operation of the keeper bank commenced at the keeper-clock falling edge 277 maintains the state of the bit line and thus the SRAM data output at the data-driven logic level (e.g., CMOS high or low) until the ensuing rising edge of the keeper clock (281), with the keeper-cell inverter (e.g., element 251 in FIG. 4) maintaining the data output for the remaining $t_{delay}$ interval between respective rising edges 281 and 283 of the keeper clock and column-select signals (i.e., keeper cell maintains the SRAM output throughout a $t_{keeper}$ interval that corresponds to the low phase of the column select signal).

An expanded, exemplary view of bit line state during $t_{boost}$ (i.e., interval in which a column-address-selected KR SRAM cell and a keeper cell both drive the bit line toward the same logic level) is presented at 290 with respect to the column 2 data readout. As shown, prior to the keeper-clock falling edge at 291, the relatively long and high-capacitance bit line is charged or discharged asymptotically toward the output logic level via the relatively small transistors within the in-cell readout structure, with the signal level being snapped (boosted) toward the CMOS output state (ground in this example, $V_{DD}$ for the opposite binary data state) in response to the falling edge of keeper clock and being latched in that state after column-select signal deassertion.

Referring collectively to FIGS. 3-5, the keeper-readout SRAM reliably (i.e., in a manner generally impervious to PVT variation) generates a valid DRAM data output (i.e., DATA$_{SR}$[N–1:0]) over at least 50% of the column clock cycle (and more than 50% of the column clock cycle where the in-cell readout structure yields sufficient bit line slew rate and/or the keeper-clock duty is reduced below 50%) without bit-line precharge or differential bit lines and without the die-area/power overhead required for conventional precharge/sense-amp timing signal generation. Moreover, in cases where the data bit does not change state from one column readout cycle to the next (e.g., as shown for the successive logic '1' readouts for col[2] and col[3] in FIG. 5), the bit line remains at steady state throughout the latter column readout cycle; a keeper-readout SRAM characteristic that may further lower readout power under conditions that yield relatively large volumes of same-state data (e.g., relatively uniform intensity values across regions of an image, relatively dim or bright scenes in which more significant bits of digitized pixel values are predominantly '1' or '0', etc.).

The various embodiments of keeper-readout SRAMs, operating methodology, implementing circuitry, host imaging ICs and devices, and so forth disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, layout, and architectural expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits and device architectures can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply details not required to practice those embodiments. For example, any of the specific bit depths, array dimensions (SRAM and/or pixel array), operating frequencies, signal duty cycles, time intervals and the like can be different from those described above in alternative embodiments. Signal paths depicted or described as individual signal lines may instead be implemented by multi-conductor signal buses and vice-versa and may include multiple conductors per conveyed signal (e.g., differential or pseudo-differential signaling). The term "coupled" is used herein to express a direct connection as well as a connection through one or more intervening functional components or structures. Programming of operational parameters (delay intervals, clock frequencies, signal duty cycles, etc.) or any other configurable parameters may be achieved, for example and without limitation, by loading a control value into a register or other storage circuit within the above-described imager IC (or other integrated circuit device in which a keeper-readout SRAM is deployed) in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An imaging integrated-circuit (IC), comprising:
   a bit line;
   a static random access memory (SRAM) cell to drive, according to a logic state of a data bit stored therein, a read-out signal onto the bit line throughout a first interval;
   an inverter circuit having a single-ended input coupled to the bit line to receive the readout-signal via and an output to generate a data output signal having a logic state according to the logic state of the data bit stored within the SRAM cell; and
   transistor circuitry to latch the data output signal at the output of the inverter circuit throughout a second interval that commences prior to conclusion of the first interval, the transistor circuitry including first and second transistors having respective gate terminals coupled to the output of the inverter circuit to switchably couple the bit line to either a first voltage node or a second voltage node, respectively, according to a voltage level of the data output signal and throughout the second interval.

2. The imaging IC of claim 1 wherein a time between commencement of the second interval and conclusion of the first interval is less than half duration of either of the first and second intervals.

3. The imaging IC of claim 1 wherein the SRAM cell constitutes a first SRAM cell within a plurality of SRAM cells organized in 'N' rows and 'n' columns within an SRAM cell array, and wherein the bit line comprises one of only N bit lines coupled to the SRAM cell array.

4. The imaging IC of claim 3 further comprising an address decoder to enable the first SRAM cell to drive the read-out signal on to the bit line in response to an address value that corresponds a column of SRAM cells that includes the first SRAM cell.

5. The imaging IC of claim 4 wherein the inverter circuit and first and second transistors are disposed within a readout structure disposed at a periphery of the SRAM cell array.

6. The imaging IC of claim 3 further comprising a control circuit to generate, in response to a clock signal, first and second control signals that define the first and second intervals, respectively.

7. The imaging IC of claim 6 wherein the control circuit to generate the first and second control signals comprises circuitry to generate first and second control signals that oscillate with a duty cycle of at least 50% and that transition at respective phase-offset times to commence the first and second intervals.

8. The imaging IC of claim 7 wherein the circuitry to generate the first and second control signals that transition at respective phase-offset times comprises a sequence of one or more inverters to generate the first control signal in response to the second control signal, and wherein a time interval between the phase-offset transitions of the first and control signal results, at least in part, from propagation delay through the sequence of one or more inverters.

9. The imaging IC of claim 7 wherein the circuitry to generate the first and second control signals that transition at respective phase-offset times comprises respective signal paths, having different propagation delays, for conducting the first and second control signals, and wherein a time interval between the phase-offset transitions of the first and control signal results, at least in part, from the different propagation delays.

10. The imaging IC of claim 1 further comprising an analog-to-digital converter (ADC) circuit to generate a digital pixel value and circuitry to load into the SRAM cell, as the data bit stored therein, a bit of the digital pixel value.

11. A method of operation within an imaging integrated-circuit (IC), the method comprising:
enabling a static random access memory (SRAM) cell to drive, according to a logic state of a data bit stored within the SRAM cell, a read-out signal onto a bit line throughout a first interval;
generating, at an output of an inverter circuit having a single-ended input coupled to the bit line, a data output signal having a logic state according to the logic state of the data bit stored within the SRAM cell; and
throughout a second interval that commences prior to conclusion of the first interval, latching the data output signal at the output of the inverter circuit by coupling the bit line to either (i) a first voltage node via a first transistor having a gate terminal coupled to the output of the inverter circuit, or (ii) a second voltage node via a second transistor having a gate terminal coupled to the output of the inverter circuit.

12. The method of claim 11 wherein a time between commencement of the second interval and conclusion of the first interval is less than half duration of either of the first and second intervals.

13. The method of claim 11 wherein the SRAM cell constitutes one of a plurality of SRAM cells organized in 'N' rows and 'n' columns within an SRAM cell array, and wherein the bit line comprises one of only N bit lines coupled to the SRAM cell array.

14. The method of claim 13 wherein enabling the SRAM cell to drive the read-out signal on to the bit line comprises decoding an address value to produce a read-enable signal that switches on a first readout structure within the SRAM cell.

15. The method of claim 14 wherein the inverter circuit and first and second transistors are disposed within a second readout structure disposed at a periphery of the SRAM cell array.

16. The method of claim 13 further comprising generating, in response to a clock signal, first and second control signals that define the first and second intervals, respectively.

17. The method of claim 16 wherein generating the first and second control signals comprises generating first and second control signals that oscillate with a duty cycle of at least 50% and that transition at respective phase-offset times to commence the first and second intervals.

18. The method of claim 17 wherein generating the first and second control signals that transition at respective phase-offset times comprises supplying the second control signal to a sequence of one or more inverters to generate the first control signal, and wherein a time interval between the phase-offset transitions of the first and control signal results, at least in part, from propagation delay through the sequence of one or more inverters.

19. The method of claim 17 wherein generating the first and second control signals that transition at respective phase-offset times comprises routing the first and second control signals over signaling paths having different propagation delays, and wherein a time interval between the phase-offset transitions of the first and control signal results, at least in part, from the different propagation delays.

20. The method of claim 11 further comprising generating a digital pixel value within an analog-to-digital converter (ADC) circuit, and loading into the SRAM cell, as the data bit stored therein, a bit of the digital pixel value.

21. An imaging integrated-circuit (IC), comprising:
a bit line;
a static random access memory (SRAM) cell to drive, according to a logic state of a data bit stored therein, a read-out signal onto the bit line throughout a first interval;
an inverter circuit having a single-ended input coupled to the bit line to receive the readout-signal via and an output to generate a data output signal having a logic state according to the logic state of the data bit stored within the SRAM cell; and
means for latching the data output signal at the output of the inverter circuit throughout a second interval that commences prior to conclusion of the first interval, the means for latching including first and second transistors having respective gate terminals coupled to the output of the inverter circuit to switchably couple the bit line to either a first voltage node or a second voltage node, respectively, according to a voltage level of the data output signal and throughout the second interval.

* * * * *